(12) United States Patent
Kim et al.

(10) Patent No.: US 9,590,227 B2
(45) Date of Patent: Mar. 7, 2017

(54) PROTECTION APPARATUS OF BATTERY PACK, METHOD OF MANUFACTURING THE PROTECTION APPARATUS, AND BATTERY PACK INCLUDING THE PROTECTION APPARATUS

(71) Applicant: Samsung SDI Co., Ltd., Yongin-si, Gyeonggi-do (KR)

(72) Inventors: Jae-Seung Kim, Yongin-si (KR); Seok Koh, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 200 days.

(21) Appl. No.: 14/248,206

(22) Filed: Apr. 8, 2014

(65) Prior Publication Data

US 2015/0004439 A1    Jan. 1, 2015

Related U.S. Application Data

(60) Provisional application No. 61/841,854, filed on Jul. 1, 2013.

(51) Int. Cl.
| | |
|---|---|
| *H01M 10/052* | (2010.01) |
| *H01M 2/34* | (2006.01) |
| *H01M 10/42* | (2006.01) |

(52) U.S. Cl.
CPC ........... *H01M 2/342* (2013.01); *H01M 2/348* (2013.01); *H01M 10/4257* (2013.01);
(Continued)

(58) Field of Classification Search
CPC ........................ H01M 10/425; H01M 10/4257
See application file for complete search history.

(56) References Cited

U.S. PATENT DOCUMENTS

| | | | | |
|---|---|---|---|---|
| 3,573,816 A | * | 4/1971 | Helgeland ............ | G01R 17/105 307/125 |
| 2006/0269831 A1 | * | 11/2006 | Kim ...................... | H01M 2/021 429/62 |

(Continued)

FOREIGN PATENT DOCUMENTS

| | | |
|---|---|---|
| EP | 2584642 A1 | 4/2013 |
| KR | 2009-0047686 A | 5/2009 |

(Continued)

OTHER PUBLICATIONS

Extended European search report issued on Sep. 4, 2014 for European Patent Application No. 14160923.0.

*Primary Examiner* — Stewart Fraser
*Assistant Examiner* — Olatunji Godo
(74) *Attorney, Agent, or Firm* — Knobbe Martens Olson & Bear LLP

(57) ABSTRACT

A protection apparatus that is disposed adjacent a first side of a bare cell of a battery having at least one electrode. The protection apparatus comprises a first and a second lead plates that are adapted to be connected to the at least one electrode of the bare cell and a pad unit comprising a plurality of conductive pads that are adapted so that external devices are coupled to the battery via the conductive pads of the pad unit. The protection apparatus also comprises a device unit that includes electrical components that provide protection to the bare cell of the battery; wiring that interconnects the first and second lead plates, the pad unit and the device unit; and an insulator that encapsulates at least a portion of the first and second lead plates, the pad unit, the device unit and the wiring.

10 Claims, 4 Drawing Sheets

(52) U.S. Cl.
CPC .... *H01M 10/052* (2013.01); *H01M 2200/106* (2013.01); *H01M 2200/30* (2013.01); *H01M 2220/30* (2013.01); *Y10T 29/49117* (2015.01)

(56) References Cited

U.S. PATENT DOCUMENTS

| | | |
|---|---|---|
| 2010/0053835 A1 | 3/2010 | Kwag et al. |
| 2010/0098974 A1 | 4/2010 | Kim et al. |
| 2010/0143753 A1* | 6/2010 | Kim .................. H01M 2/1066 429/7 |
| 2010/0151280 A1* | 6/2010 | Koh .................. H01M 2/0404 429/7 |
| 2011/0123842 A1 | 5/2011 | Kim |
| 2012/0160552 A1 | 6/2012 | Jang et al. |

FOREIGN PATENT DOCUMENTS

| | | |
|---|---|---|
| KR | 2010-0028010 A | 3/2010 |
| KR | 2010-0044487 A | 4/2010 |
| WO | WO 2006/115342 A1 | 11/2006 |
| WO | WO 2013/055026 A1 | 4/2013 |

* cited by examiner

PROTECTION APPARATUS OF BATTERY PACK, METHOD OF MANUFACTURING THE PROTECTION APPARATUS, AND BATTERY PACK INCLUDING THE PROTECTION APPARATUS

BACKGROUND

Field

One or more embodiments of the present invention relate to a protection apparatus for a battery pack, a method of manufacturing the protection apparatus, and a battery pack including the protection apparatus.

Description of the Related Technology

Recently, battery packs are being variously used as power sources for portable electronic devices. Also, due to use of portable electronic devices in various fields, the demand for battery packs has been increasing. Battery packs are charged and discharged for a plurality of uses, and accordingly, economic and environmental effects thereof are high. Accordingly, use of battery packs is promoted.

Also, since smaller and more lightweight electronic devices are required, smaller and more lightweight battery packs are also required. However, battery packs include a highly reactive material, such as lithium. Accordingly, stability thereof is a limiting factor in manufacturing smaller and more lightweight battery packs. Thus, various researches for the development of small and light-weight battery packs with high stability are being performed.

SUMMARY OF CERTAIN INVENTIVE ASPECTS

One or more embodiments of the present invention provide a protection apparatus for a battery pack which is capable of being lightweight and miniaturized, a method of manufacturing the protection apparatus, and a battery pack including the protection apparatus.

According to an embodiment of the present invention, due to the packaging of a protection apparatus for a battery pack, the protection apparatus for a battery pack may be miniaturized.

In one aspect or embodiment, the invention comprises a protection apparatus for a battery assembly, the protection apparatus being adapted to be disposed adjacent a first side of a bare cell of a battery having at least one electrode. In this aspect, the protection apparatus comprises a first and a second lead plates that are adapted to be connected to the at least one electrode of the bare cell and a pad unit comprising a plurality of conductive pads that are adapted so that external devices are coupled to the battery via the conductive pads of the pad unit. In this aspect, the protection apparatus also comprises a device unit that includes electrical components that provide protection to the bare cell of the battery; wiring that interconnects the first and second lead plates, the pad unit and the device unit; and an insulator that encapsulates at least a portion of the first and second lead plates, the pad unit, the device unit and the wiring.

In another aspect or embodiment, the invention comprises a method of manufacturing a protection apparatus for a battery, the method comprising patterning a conductive plate to form a first lead plate, a second lead plate, a pad unit and a frame wherein the first lead plate, the second lead plate and the pad unit are maintained in a desired orientation with respect to each other by the frame and mounting a device unit on the patterned conductive plate that is maintained within the frame. In this aspect, the method further comprises interconnecting the device unit, the first lead plate, the second lead plate and the pad unit by extending wiring between at least some of the device unit, the first lead plate and the pad unit; covering at least a portion of the first lead plate, the second lead plate the device unit, the pad unit and the wiring with an insulator; and removing the frame.

Also, due to the inclusion of a protection apparatus for a battery pack and a temperature protection device, even when a battery pack is miniaturized, the battery pack may have improved stability.

DETAILED DESCRIPTION OF CERTAIN INVENTIVE EMBODIMENTS

Hereinafter, the present invention will be described more fully with reference to the accompanying drawings, in which exemplary embodiments of the invention are shown. This invention may, however, be embodied in many different forms and should not be construed as limited to the exemplary embodiments set forth herein. It would be obvious to those of ordinary skill in the art that the exemplary embodiments are to cover all modifications, equivalents, and alternatives falling within the scope of the invention. In the following description, well-known functions or constructions are not described in detail if it is determined that they would make the invention unclear due to unnecessary detail.

It will be understood that, although the terms 'first', 'second', 'third', etc., may be used herein to describe various elements, these elements should not be limited by these terms. These terms are only used to distinguish one element, component, region, layer or section from another region, layer or section.

The terms used herein are used to explain only particular embodiments, and are not intended to limit the scope of the present invention. The use of the terms "a" and "an" and "the" and similar referents in the context of describing the invention are to be construed to cover both the singular and the plural. The terms "include" or "have" are used to indicate that characteristics, numbers, processes, operations, constituents, or a combination thereof used in the specification exist, and should be considered such that the existence of one or more characteristics, numbers, processes, operations, constituents, or a combination thereof or possibility of the addition thereof is not excluded in advance.

Hereinafter, one or more embodiments of the present invention are described in detail by referring to the attached drawings illustrating the embodiments.

Figure 1:
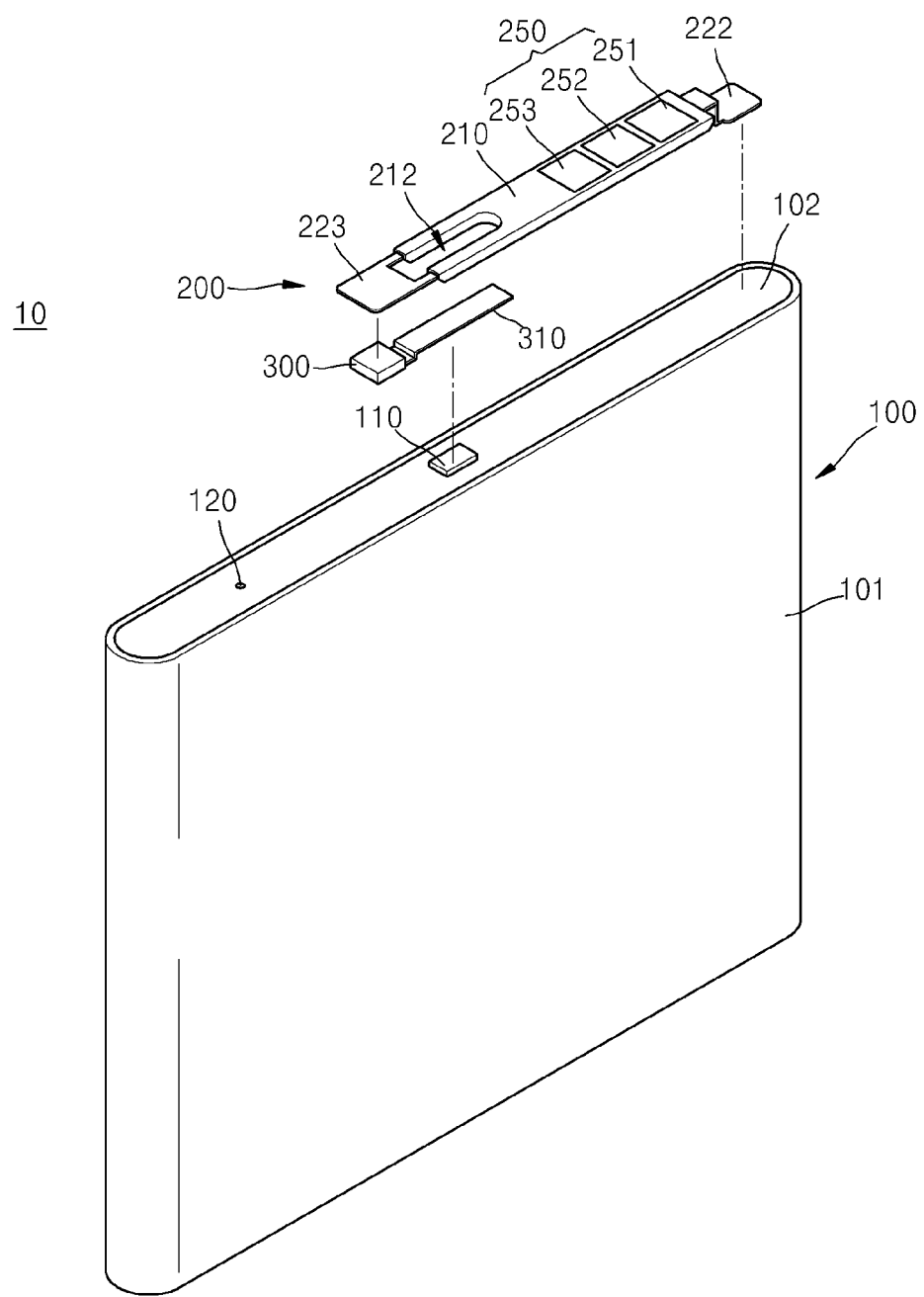
FIG. 1 is a schematic perspective view of a battery pack according to an embodiment of the present invention.
Figure 2:
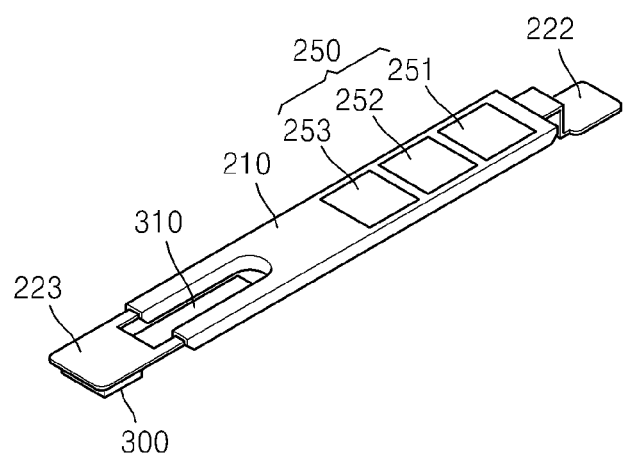
FIGS. 2 and 3 are schematic perspective views of a protection apparatus included in the battery pack of FIG. 1.
Figure 3:
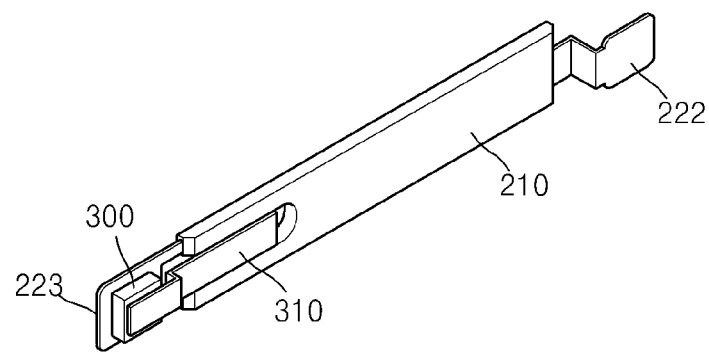

FIG. 1 is a schematic perspective view of a battery pack 10 according to an embodiment of the present invention. FIGS. 2 and 3 are schematic perspective views of a protection apparatus 200 included in the battery pack 10 of FIG. 1.

First, referring to FIG. 1, the battery pack 10 according to the present embodiment may include a bare cell 100, a protection apparatus 200 for the battery pack 10, provided on a side of the bare cell 100, and a temperature protection device 300 disposed between the bare cell 100 and the protection apparatus 200.

The bare cell 100 may include a can 101 housing an electrode assembly (not shown) and a cap plate 102 that is coupled to the can 101 to seal the bare cell 100.

An electrode assembly (not shown) may include an anode plate and a cathode plate, each having an electrode active material doped thereon, and a separator disposed between the anode plate and the cathode plate. According to an embodiment of the present invention, an electrode assembly (not shown) may be manufactured by winding a stack structure, which includes the anode plate, the separator, and the cathode plate sequentially stacked in this stated order, in a jelly-roll form. According to another embodiment of the present invention, although not illustrated in the drawing, an electrode assembly (not shown) may have a structure including the anode plate, the separator, and the cathode plate which are sequentially stacked in this stated order.

The can 101 may have an upper portion having an opening (not shown) for the insertion of an electrode assembly (not shown). The can 101 may be formed of a conductive member, such as aluminum. The can 101 may protect the electrode assembly from external impacts, and may act as a heat-dissipating plate that emits heat caused during charging and discharging of the electrode assembly to the outside.

The cap plate 102 and the can 101 may be formed of the same material, and when the electrode assembly (not shown) is inserted into the can 101, the cap plate 102 is disposed on a side of the can 101 and attached to the can 101 by, for example, welding, thereby sealing the bare cell 100 together with the can 101.

An electrode terminal 110 is disposed on the cap plate 102. The electrode terminal 110 may be electrically connected to, for example, an anode plate (not shown) of the electrode assembly. Also, a cathode plate (not shown) of the electrode assembly (not shown) may be may be electrically connected to the cap plate 102. However, the present embodiment is not limited thereto, and according to purpose, the electrode terminal 110 may be connected to a cathode of the electrode assembly and the cap plate 102 may be electrically connected to an anode of the electrode assembly. Also, an insulator (not shown) is disposed between the electrode terminal 110 and the cap plate 102 to prevent occurrence of shorting between the electrode terminal 110 and the cap plate 102.

The cap plate 102 may have an electrolyte inlet 120. When the cap plate 102 is coupled to the can 101, an electrolyte is provided into the can 101 through the electrolyte inlet 120, and once the providing of the electrolyte is completed, the electrolyte inlet 120 may be sealed by a cover (not shown).

The protection apparatus 200 may be disposed on a side of the bare cell 100, and may be electrically connected to the bare cell 100 to control over-charging and under-discharging of the bare cell 100. The protection apparatus 200 may include an insulator 210 that constitutes a body of the protection apparatus 200, a pad unit 250 that contacts an external device, and a first lead plate 222 and a second lead plate 223 which extend from the insulator 210 to be exposed to the outside.

The insulator 210 may seal a device unit (see 230 of FIG. 4) and a wiring unit (see 240 of FIG. 4) therein so that the device unit 230 and the wiring unit 240 are not exposed to the outside, and also, may fix locations of the device unit 230 and the wiring or wiring unit 240. In detail, the device unit 230 and the wiring unit 240 are disposed on a pattern unit (see 220 of FIG. 4), and then, the device unit 230 and the wiring unit 240 are sealed to form the insulator 210.

That is, the protection apparatus 200 is manufactured by packaging an electronic device that is to be mounted on a printed circuit board and a printed circuit board, and is capable of being miniaturized. A related description will be presented later in connection with FIG. 4.

The insulator 210 may be formed of a polymer resin, such as polycarbonate, and may be formed by, for example, molding.

Also, the insulator 210 may have an opening 212. The opening 212 may be formed to correspond to where the electrode terminal 110 is located. Since the electrode terminal 110 is attached to an electrode tab 310, which will be described later, by welding, due to the formation of the opening 212 corresponding to where the electrode terminal 110 is located, welding of the electrode tab 310 to the electrode terminal 110 may be easily performed.

A pad unit 250 electrically contacts an external device, and may be formed by removing a portion of the insulator 210 to be exposed to the outside. The pad unit 250 may include a first pad 251 to which a first voltage is applied, a second pad 252 to which a second voltage is applied, and a third pad 253 that is a ground pad.

The first lead plate 222 extends from an end of the insulator 210 in a first direction and is exposed to the outside, and may be electrically connected to the cap plate 102. For example, the first lead plate 222 may be attached to the cap plate 102 by, for example, welding, and to do this, a portion of the first lead plate 222 may have a bent shape.

Also, the first lead plate 222 may be integrally formed with the first pad 251. Accordingly, a first voltage applied to the cap plate 102 may be applied to the first pad 251 through the first lead plate 222. For example, the first voltage may be a positive voltage.

The second lead plate 223 may extend from the other end of the insulator 210 in a second direction opposite to the first direction and may be exposed to the outside, and a second voltage may be applied thereto from the electrode terminal 110. For example, the second voltage may be a negative voltage. The first pad unit 251 can be connected to the second lead plate 223 via the device unit 230 and the wiring unit 240. Also, the second lead plate 223 may be connected to the second pad 252, and the second voltage applied from the electrode terminal 110 may be applied to the second pad 252.

The temperature protection device 300 is disposed between the bare cell 100 and the protection apparatus 200, and prevents ignition or explosion of the battery pack 10 due to an excess current. For example, a side of the temperature protection device 300 is connected to the second lead plate 223, and the other side of the temperature protection device 300 is electrically connected to the electrode terminal 110 through the electrode tab 310.

The temperature protection device 300 is a device that allows a current to flow therethrough or insulates the flow of a current, and may be formed of, for example, a polymer PTC in which a conductive particle, such as a metal particle or a carbon particle, is dispersed in a crystalline polymer. However, a material for the temperature protection device 300 is not limited thereto.

Also, FIGS. 2 and 3 are views of the protection apparatus 200 and the temperature protection device 300 of the battery pack 10 of FIG. 1, wherein the protection apparatus 200 is attached to the temperature protection device 300.

Referring to FIGS. 2 and 3, and FIG. 1, the temperature protection device 300 may have a flat layer shape, and a side of the temperature protection device 300 may be attached to the second lead plate 223 by, for example, welding, and the other side thereof may be attached to an end of the electrode tab 310. In this regard, the other end of the electrode tab 310 is attached to the electrode terminal 110, and in consideration of the height of the electrode terminal 110, a portion of the electrode tab 310 may be bent so that the electrode tab 310 has a step shape.

Also, since the opening 212 of the insulator 210 is formed to correspond to where the electrode terminal 110 is located, the electrode tab 310 that electrically connects the temperature protection device 300 to the electrode terminal 110 may be located inside the opening 212. As described above, since the electrode tab 310 is located inside the opening 212, during the welding of the electrode terminal 110 to the electrode tab 310, a welding rod (not shown) may have easy access to the electrode tab 310 through the opening 212. Accordingly, the battery pack 10 may be more efficiently manufactured.

Also, since the location and size of the opening 212 may vary according to where the electrode terminal 110 of the battery pack 10 is located, the protection apparatus 200 may be used in various battery packs, each of which includes an electrode terminal positioned in a different location.

Also, since the temperature protection device 300 is located outside the electrode terminal 110, a side of the battery pack 10 on which the protection apparatus 200 is to be disposed may be used as needed according to battery design. Accordingly, the location of the temperature protection device 300 may be freely determined, and even when the battery pack 10 is small in size, the temperature protection device 300 having a predetermined size may be easily mounted thereon.

Also, although not illustrated, the battery pack 10 may further include a protection cover (not shown) that protects the protection apparatus 100 and a label (not shown) surrounding the can 101.

The protection cover may be disposed above the bare cell 100 on which the protection apparatus 200 is mounted to protect the protection apparatus 200 from the outside. In this regard, the protection cover may have openings (not shown) located corresponding to the pad unit 250, and through the openings (not shown), the pad unit 250 may be connected to an external device to supply or receive power.

Figure 4:
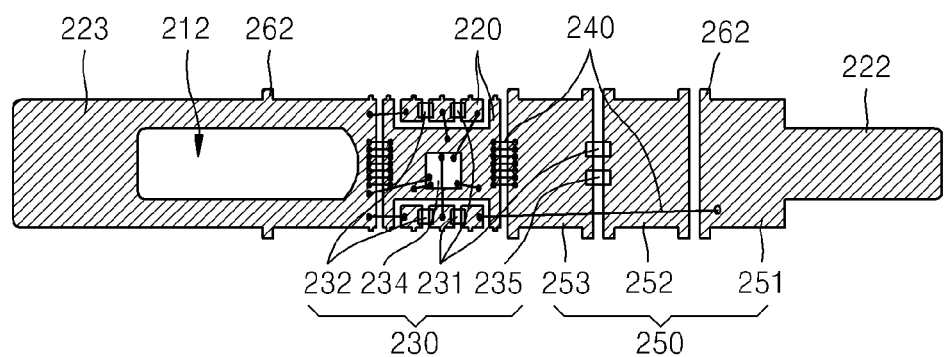
FIG. 4 is a schematic plan view of a protection apparatus included in the battery pack of FIG. 1 from which a portion of an insulator is removed.

FIG. 4 is a schematic plan view of a protection apparatus included in the battery pack of FIG. 1 from which a portion of an insulator is removed.

Hereafter, in connection with FIGS. 1 to 4, the protection apparatus 200 is described. The protection apparatus 200 may further include, in addition to the first lead plate 222, the second lead plate 223, and the pad unit 250, the pattern unit 220, the device unit 230, and the wiring unit 240 disposed inside the insulator 210.

The pattern unit 220 may be formed of the same material as used to form the first lead plate 222, the second lead plate 223, and the pad unit 250, and may include a plurality of metal patterns separated from one other. Also, since the pattern unit 220 is electrically connected to the first lead plate 222, the second lead plate 223, and the pad unit 250 by the device unit 230 and the wiring unit 240, the pattern unit 220 may act as a circuit pattern together with the first lead plate 222, the second lead plate 223, and the pad unit 250.

The device unit 230 may prevent over-charging, under-discharging, excess current, shorts, and reverse voltage of the battery pack 10, so that explosion, over-heating, leakage, and deterioration in charging and discharging characteristics of the battery pack 10 are prevented. Furthermore, a decrease in electric performance and abnormal behavior may be suppressed to remove risk factors, thereby extending a lifespan for use.

The device unit 230 may include a resistor 231, a capacitor 232, a varistor 235 and a switching device, such as an integrated circuit IC 234, and may be sealed by the insulator 210.

The resistor 231, the capacitor 232, and the varistor 235 may connect the pattern unit 220 and the pad unit 250 which are separated from each other, thereby forming a circuit. For example, the second pad 252 is connected to the third pad 253 through the resistor 231 and the varistor 235, and a plurality of metal patterns that constitute the pattern unit 220 may be connected to one other through the resistor 231 and the capacitor 232. However, embodiments of the present invention are not limited thereto, and the device unit 230 may be appropriately aligned such that the protection apparatus 200 operates as a protection circuit module PCM of the battery pack 10.

The integrated circuit 234 may be located on the pattern unit 220, and may control the electrode assembly (not shown) inside the bare cell 100, or may block the circuit when the electrode assembly abnormally operates.

The wiring unit 240 allows the first lead plate 222, the second lead plate 223, the pad unit 250, and the pattern unit 220 to be connected one other, and due to the wiring unit 240, an electric connection may be made from the first lead plate 222 to the second lead plate 223.

Also, a support 262 having a protruding shape may be formed on a side of each of the first lead plate 222, the second lead plate 223, the pad unit 250, and the pattern unit 220. The support 262, to be described later, is used to fix the first lead plate 222, the second lead plate 223, the pad unit 250, and the pattern unit 220 on the frame 260 of FIG. 5 before the insulator 210 is formed. Once the insulator 210 is formed, the support 262 is removed by cutting. Accordingly, an external surface of an end of the support 262 may be exposed to the outside of the insulator 210.

Figure 5:
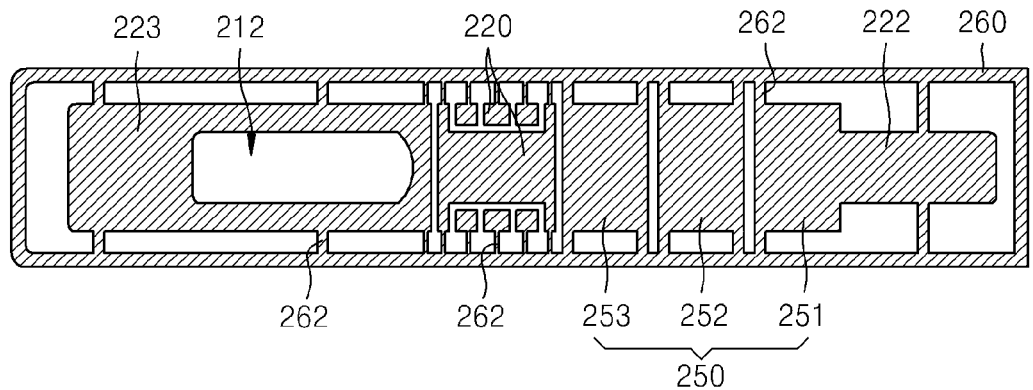
FIGS. 5, 6 and 7 are schematic plan views to explain a method of manufacturing a protection apparatus included in the battery pack of FIG. 1.
Figure 6:
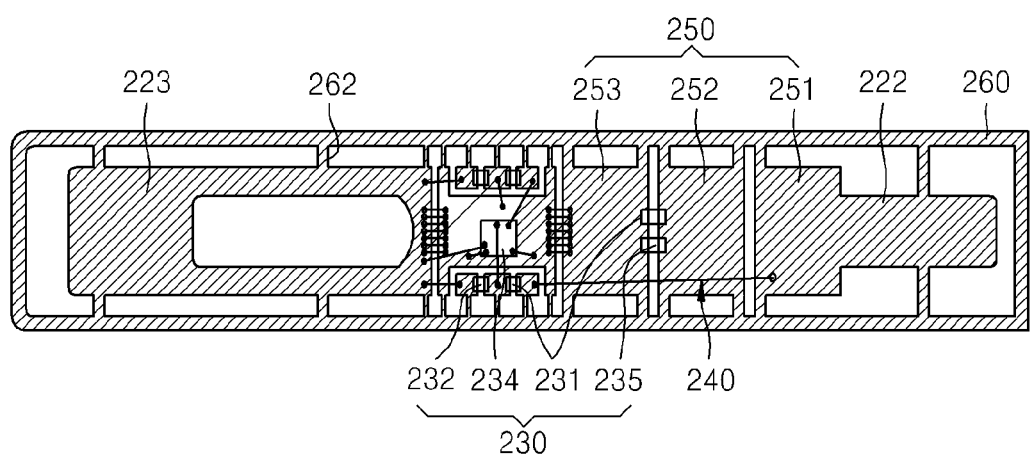
Figure 7:
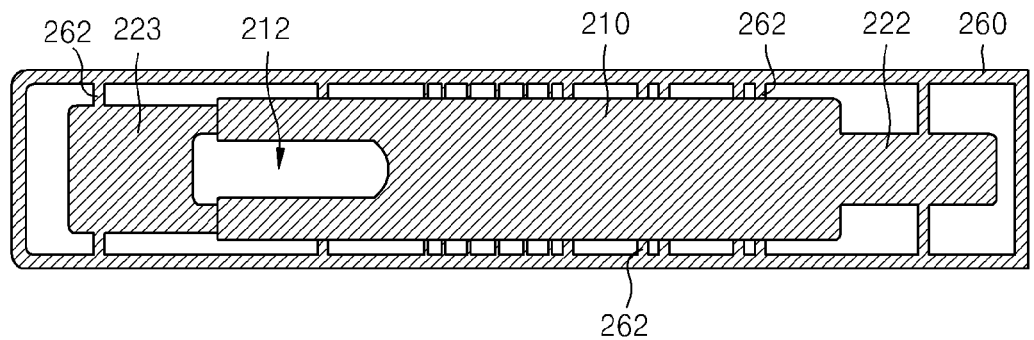

FIGS. 5, 6 and 7 are schematic plan views to explain a method of manufacturing a protection apparatus 200 included in the battery pack 10 of FIG. 1.

A method of manufacturing the protection apparatus 200 will be described in connection with FIGS. 5 to 7 and 1. First, as illustrated in FIG. 5, a conductive plate is patterned to form the pattern unit 210, the first lead plate 222, the second lead plate 223, and the pad unit 250.

The patterning may be performed by cutting or etching a conductive plate. In this regard, due to the support 262, the pattern unit 210, the pad unit 250, the first lead plate 222, and the second lead plate 223 may be fixed on the frame 260.

Also, the pad unit 250 may include the first pad 251, the second pad 252, and the third pad 253 which are separated from each other. From among the first pad 251, the second pad 252, and the third pad 253, the first pad 251 may be integrally formed with the first lead plate 222.

The second lead plate 223 may have the opening 212. The opening 212 may be, as described above, formed to correspond to where the electrode terminal 110 is located, and the location and size of the opening 212 may vary according to the location of the electrode terminal 110 of the battery pack 10 on which the protection apparatus 200 is mounted.

Then, as illustrated in FIG. 6, the device unit 230 is mounted on the patterned conductive plate, and the pattern unit 210, the first lead plate 222, the second lead plate 223, and the pad unit 250 are connected to one other by using the wiring unit 240.

For example, the resistor 231 and the varistor 235 may be mounted between the second pad 252 and the third pad 253, and the resistor 231 and the capacitor 232 may be mounted such that a plurality of metal patterns constituting the pattern unit 210 are connected to one other. However, the present embodiment is not limited thereto.

Also, the wiring unit 240 may electrically connect the integrated circuit 234 to the pattern unit 210, the pattern unit 210 to the first lead plate 222, the pattern unit 210 to the first pad 251, and the pattern unit 210 to the third pad 253.

Since locations of the pattern unit 210, the pad unit 250, the first lead plate 222, and the second lead plate 223 in the frame 260 are fixed due to the support 262, the device unit 230 and the wiring unit 240 may be precisely mounted.

Subsequently, as illustrated in FIG. 7, the insulator 210 is formed. The insulator 210 may be formed of a polymer material, such as polycarbonate, and may be formed by, for example, molding.

The insulator 210 may seal the device unit 230 and the wiring unit 240 so that the device unit 230 and the wiring unit 240 are not exposed to external water molecules or oxygen.

Also, the insulator 210 may have the opening 212. The opening 212 may be formed by forming the insulator 210 along the shape of the opening 212 of the second lead plate 223.

After the formation of the insulator 210, the support 262 is cut to separate the protection apparatus 200 from the frame 260. Due to the cutting of the support 262, the pattern unit 210, the pad unit 250, the first lead plate 222, and the second lead plate 223 connected to one other by the device unit 230 and the wiring unit 240 act together as a protection circuit module.

In this regard, the cut portion of the support 262, that is, an external surface of an end of the support 262 may be exposed to the outside of the insulator 210 through the insulator 210. That is, the support 262 is surrounded by the insulator 210, and thus, a binding force between each of the pattern unit 210, the pad unit 250, the first lead plate 222, and the second lead plate 223, each including the support 26, and the insulator 210 may be increased.

Also, before or after the support 262 is removed by cutting, an opening (not shown) exposing the pad unit 250 is formed in the insulator 210. The opening (not shown) is formed to correspond to the first pad 251, the second pad 252, and the third pad 253 by using, for example, a laser process or an etching process.

As described above, the protection apparatus 200 according to an embodiment of the present invention has a packaged structure manufactured as follows: a single conductive plate is patterned, and then, the device unit 230 or the like is mounted on the patterned conductive plate, and then, the resultant structure is sealed by the insulator 210. Accordingly, the protection apparatus 200 may be precisely manufactured, and accordingly, the protection apparatus 200 is capable of being miniaturized.

Also, the packaged protection apparatus 200 is more easily handled than a conventional structure in which an electronic device is mounted on a printed circuit board, and since the temperature protection device 300 and the electrode tab 310 are attached to the packaged protection apparatus 200 before the packaged protection apparatus 200 is attached to the bare cell 100, the manufacturing process of the battery pack 10 may be simplified.

That is, as illustrated in FIGS. 2 and 3, the protection apparatus 200, to which the temperature protection device 300 and the electrode tab 310 are attached, is coupled to the bare cell 100 by the attachment of the first lead plate 222 to the cap plate 102 and the attachment of the electrode tab 310 to the electrode terminal 110. Accordingly, the manufacturing process of the battery pack 10 can be simplified.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A protection apparatus for a battery assembly, the protection apparatus being adapted to be disposed adjacent a first side of a bare cell of a battery having at least one electrode, the protection apparatus comprising:
   a first and a second lead plates that are adapted to be connected to the at least one electrode of the bare cell;
   a pad unit comprising a plurality of conductive pads that are adapted so that external devices are coupled to the battery via the conductive pads of the pad unit;
   a device unit that includes electrical components that provide protection to the bare cell of the battery;
   wiring that interconnects the first and second lead plates, the pad unit and the device unit; and
   an insulator that encapsulates at least a portion of the first and second lead plates, the pad unit, the device unit and the wiring so that the device unit and the wiring are not exposed to the outside of the insulator.

2. The apparatus of claim 1, further comprising a temperature protection device that is adapted to be interposed between the second lead plate and the bare cell of the battery.

3. The apparatus of claim 2, wherein the temperature protection device includes an electrode tab that is adapted to be connected to a first electrode of the bare cell of the battery.

4. The apparatus of claim 3, wherein the insulator includes an opening that is positioned to expose the electrode tab of the temperature protection device in a location adjacent the first electrode of the bare cell of the battery.

5. The apparatus of claim 1, wherein the plurality of conductive pads of the pad unit are electrically connected to the lead plates via the device unit and the wiring wherein the insulator fixes the first and second electrode, the pad unit, the device unit and the wiring in position with respect to each other.

6. The apparatus of claim 5, wherein a first pad is connected directly to the first lead plate and is connected to the second lead plate via the device unit.

7. The apparatus of claim 5, wherein a second pad is electrically connected to the second lead plate by the device unit and the wiring.

8. The apparatus of claim 1, wherein the device unit comprises a resistor, capacitor, varistor and a switching device.

9. The apparatus of claim 1, further comprising a plurality of support members that extend outward from the device unit, the pad unit and the first and second lead plates so as to extend into the insulator.

10. The apparatus of claim 9, wherein the plurality of support members have outer ends that are exposed outside of the insulator.

* * * * *